(12) United States Patent
Yun et al.

(10) Patent No.: US 7,691,719 B2
(45) Date of Patent: Apr. 6, 2010

(54) SEMICONDUCTOR DEVICE HAVING STORAGE NODES AND ITS METHOD OF FABRICATION

(75) Inventors: Cheol-Ju Yun, Gyeonggi-do (KR); Kang-Yoon Lee, Gyeonggi-do (KR); In-Ho Nam, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 795 days.

(21) Appl. No.: 11/457,726

(22) Filed: Jul. 14, 2006

(65) Prior Publication Data

US 2007/0015362 A1    Jan. 18, 2007

(30) Foreign Application Priority Data

Jul. 14, 2005    (KR) .................... 10-2005-0063874

(51) Int. Cl.
*H01L 21/20*    (2006.01)
*H01L 21/8242*    (2006.01)

(52) U.S. Cl. .................. 438/396; 438/393; 438/244; 438/253

(58) Field of Classification Search .............. 438/396, 438/689, 253, 244, 393, 250, 255, 387, 397, 438/398
See application file for complete search history.

(56) References Cited

U.S. PATENT DOCUMENTS 6,410,423 B1    6/2002   Anezaki et al.
6,537,875 B2    3/2003   Won et al.
6,624,525 B2    9/2003   Anezaki et al.
2003/0153146 A1*    8/2003   Won et al. .................. 438/253
2006/0118885 A1    6/2006   Song
2007/0045703 A1*    3/2007   Choi .......................... 257/308

FOREIGN PATENT DOCUMENTS

JP    2001-057386    2/2001
KR    10-2006-0010930    2/2006

OTHER PUBLICATIONS

English language abstract of Japanese Publication No. 2001-057386.

* cited by examiner

*Primary Examiner*—Chuong A. Luu
(74) *Attorney, Agent, or Firm*—Volentine & Whitt, PLLC

(57) ABSTRACT

Embodiments of a semiconductor device having storage nodes include an interlayer insulating layer disposed on a semiconductor substrate; a conductive pad disposed in the interlayer insulating layer to contact with a predetermined portion of the substrate, an upper portion of the conductive pad protruding above the interlayer insulating layer; an etch stop layer disposed on the conductive pad and the interlayer insulating layer; and storage nodes penetrating the etch stop layer and disposed on the conductive pad. A penetration path of wet etchant is completely blocked during the wet etch process that removes the mold oxide layer. Therefore, inadvertent etching of the insulating layer due to penetration of wet etchant is prevented, resulting in a stronger, more stable, storage node structure.

16 Claims, 11 Drawing Sheets

SEMICONDUCTOR DEVICE HAVING STORAGE NODES AND ITS METHOD OF FABRICATION

CROSS-REFERENCE TO RELATED APPLICATION

This application claims priority from Korean Patent Application No. 2005-63874, filed Jul. 14, 2005, the disclosure of which is hereby incorporated herein by reference in its entirety as if set forth fully herein.

BACKGROUND OF INVENTION

1. Technical Field

The present invention relates to a semiconductor device and its method of fabrication, and more particularly, to a semiconductor device having storage nodes and its method of fabrication.

2. Discussion of the Related Art

With highly integrated semiconductor devices, a design rule is reduced. The process redundancy for the manufacturing of semiconductor devices is also reduced. In particular, as efforts to develop giga-bit devices are made in the case of a dynamic random access memory (DRAM), the importance of a design rule or a process redundancy in the semiconductor fabrication processes and operational characteristics of the devices are increased.

In particular, the capacitor used in the DRAM must ensure not less than a predetermined capacitance in a limited area to provide normal input/output of data or guarantee refresh characteristics. Various types of capacitors have been proposed, such as a trench type, a stack type, or their combination. However, even with efforts to increase the capacitance through structural improvements of the storage nodes, development of a highly integrated next-generation device is limited because of design rule limitations and problems with generally complicated processes. Therefore, a new capacitor structure is needed to overcome these problems. Developing a new structure without depending just on the structural improvements of the storage node, a capacitor over bitline (COB) structure has been proposed to form a storage node after forming a bit line, and used.

FIGS. 1A through 1E are cross-sectional views illustrating a method of fabricating a conventional storage node. The method of fabricating the conventional storage node having the COB structure described as above will be explained in reference to the figures.

As shown in FIG. 1A, a semiconductor substrate 1 having a predetermined lower structure including a transistor (not shown) and a bit line (not shown) is prepared. A lower insulating layer 3 is formed on the substrate 1. The lower insulating layer 3 is patterned, thereby forming first contact holes 4 that expose a predetermined portion of the substrate 1. Buried contact plugs 5 are formed to fill the first contact holes 4. An upper insulating layer 7 is formed on the substrate having the buried contact plugs 5, and is etched, thereby forming second contact holes 8 that expose the buried contact plugs 5 and extend along one direction with a wider contact area than that of the buried contact plugs 5. A buffer conductive layer 9 is formed on the substrate having the second contact holes 8.

As shown in FIG. 1B, the buffer conductive layer 9 is etched until the surface of the upper insulating layer 7 is exposed, thereby forming a buffer conductive layer pattern 9a that fills the second contact holes 8. A process of etching the buffer conductive layer 9 may use an etch back process or a chemical mechanical polishing (CMP) process. The buffer conductive layer pattern 9a is formed to prevent contact failures between the buried contact plug 5 and storage nodes to be formed later.

As shown in FIG. 1C, an etch stop layer 11 and a mold oxide layer 13 are sequentially formed on the substrate having the buffer conductive layer pattern 9a. The etch stop layer 11 may include a silicon nitride layer, and the mold oxide layer 13 may include a silicon oxide layer. The mold oxide layer 13 and the etch stop layer 11 are sequentially patterned, thereby forming storage node contact holes 14 that expose the buffer conductive layer pattern 9a.

As shown in FIG. 1D, a conformal storage node layer 15 is formed on the semiconductor substrate having the storage node contact holes 14. The storage node layer 15 may include a polycrystalline silicon layer.

As shown in FIG. 1E, the storage node layer 15 is treated using an etch back process until the mold oxide layer is exposed, thereby forming cylinder-shaped storage nodes 15a. After the etching, the remaining mold oxide layer is removed. The removal of the mold oxide layer may be performed using a wet etch process. The wet etch process normally uses an etchant of diluted HF (DHF) or buffered oxide etchants (BOE). In particular, an etchant having an etch rate for the silicon oxide layer of 500 Å/min. or less is called low advanced low (LAL). The LAL includes two types: LAL 500 and LAL 200, the etch rates of which are 500 Å/min. and 200 Å/min. respectively. To remove the mold oxide layer the etchant may be either LAL 500 or LAL 200.

As shown in FIG. 2, which is an enlarged view of an A portion of FIG. 1E, etch residue 17 may exist on bottom surfaces and lower side surfaces of the storage node contact holes 14 after the process of etching the mold oxide layer and the etch stop layer. In this case, if etchant permeates into the storage node contact holes 14 during a wet etch process to remove the remaining mold oxide layer, since the etch residue 17 act as a chemical path, the upper insulating layer 7 and the lower insulating layer 3 below the etch stop layer, and even the bit line of the substrate or the insulating layer surrounding the transistor are etched (see reference numeral a). As a result, the etch stop layer may collapse at the etched portion, and the storage nodes are not supported well at their base due to the etching of the insulating layers. Production yield of these devices then decreases.

After the storage node contact holes are formed, a cleaning process to remove the etch residues may be additionally performed. However, to completely remove the etch residues, time for the cleaning process must be lengthened.

Therefore, there is a need to develop a capacitor and a method for its fabrication having reduced damages to the storage nodes from a wet etch process to remove the mold oxide layer, despite etch residues that may exist between the etch stop layer and the storage nodes inside the storage node contact holes.

SUMMARY OF THE INVENTION

Therefore, embodiments of the present invention are directed to provide a semiconductor device for preventing damage of a storage node due to penetration of etchant during a wet etch process of removing a mold oxide layer, and a method of fabricating the same.

In accordance with an exemplary embodiment, a semiconductor device includes an interlayer insulating layer disposed on a semiconductor substrate; a conductive pad disposed in the interlayer insulating layer to contact with a predetermined portion of the substrate, an upper portion of the conductive pad being relatively protruded from the interlayer insulating layer; an etch stop layer disposed on the conductive pad and the interlayer insulating layer; and storage nodes penetrating the etch stop layer and disposed on the conductive pad.

An upper portion of the conductive pad may protrude above the interlayer insulating layer by about 300 Å to 2000 Å.

The interlayer insulating layer may be composed of a lower insulating layer and an upper insulating layer, which are sequentially stacked. The conductive pad may include a buried contact plug disposed in the lower insulating layer to contact with a predetermined portion of the substrate; and a buffer conductive layer pattern covering at least a portion of the buried contact plug, an upper portion of the buffer conductive layer pattern protruding above the upper insulating layer.

The buried contact plug and the buffer conductive layer pattern may be one of a polycrystalline silicon layer and a metal layer. Preferably, the buffer conductive layer pattern may have a thickness of 1500 Å to 2500 Å.

The conductive pad may include a buried contact plug disposed in the lower insulating layer to contact with a predetermined portion of the substrate, an upper portion of the buried contact plug being relatively protruded from the lower insulating layer; and a buffer conductive layer pattern covering at least a portion of the buried contact plug, and extending along one direction to have a wider area than that of the buried contact plug, an upper portion of the buffer conductive layer pattern being relatively protruded from the upper insulating layer.

Preferably, an upper portion of the buried contact plug may protrude above the lower insulating layer by about 300 Å to 2000 Å.

In another aspect of the present invention, an embodiment provides a method of fabricating a semiconductor device including forming an interlayer insulating layer on a semiconductor substrate; forming a conductive pad in the interlayer insulating layer; selectively etching the interlayer insulating layer so that an upper portion of the conductive pad protrudes above the interlayer insulating layer; sequentially forming an etch stop layer and a mold oxide layer on the interlayer insulating layer and the protruded buffer conductive layer pattern; etching the mold oxide layer and the etch stop layer to expose an upper surface of the buffer conductive layer pattern; and forming a storage node on the exposed upper surface of the buffer conductive layer pattern.

The operation of selectively etching the interlayer insulating layer may be performed such that an upper portion of the conductive pad protrudes above the interlayer insulating layer by about 300 Å to 2000 Å.

Preferably, the operation of forming the interlayer insulating layer may include sequentially forming a lower insulating layer and an upper insulating layer.

The operation of forming the conductive pad may include selectively etching the upper insulating layer, thereby forming a trench; selectively etching the lower insulating layer exposed by the trench, thereby forming a via hole that exposes a predetermined portion of the substrate; forming a conductive layer on the substrate having the via hole; and planarizing the conductive layer to fill the trench and the via hole.

The operation of forming the conductive pad may include forming a buried contact plug in the lower insulating layer to contact with a predetermined portion of the substrate; forming an upper insulating layer on the substrate having the buried contact plug; and forming a buffer conductive layer pattern covering at least a portion of the buried contact plug in the upper insulating layer.

After forming the buried contact plug, the method may further include selectively etching the lower insulating layer so that an upper portion of the buried contact plug protrudes above the lower insulating layer.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1A:
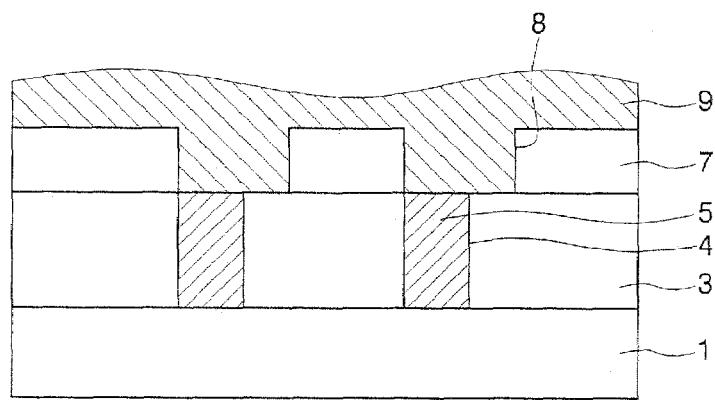
FIGS. 1A through 1E are cross-sectional views illustrating a conventional method of fabricating a semiconductor device having storage nodes.
Figure 1B:
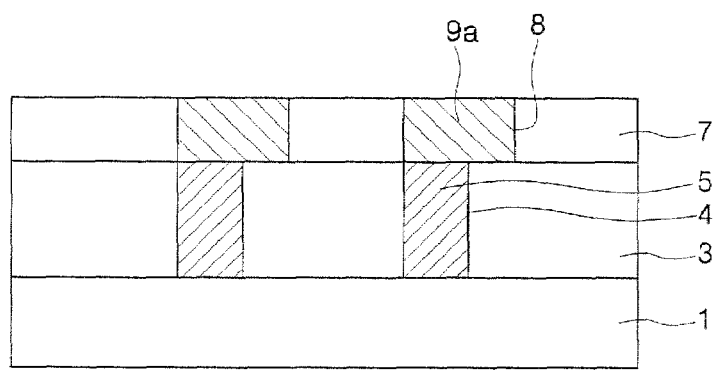
Figure 1C:
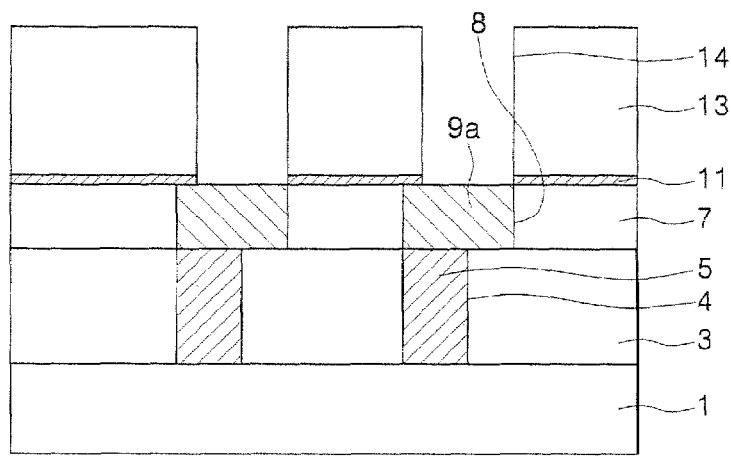
Figure 1D:
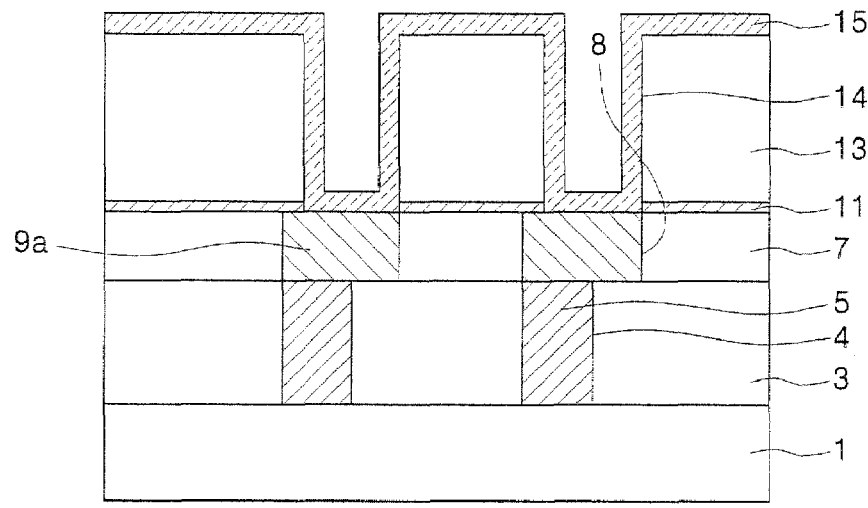
Figure 1E:
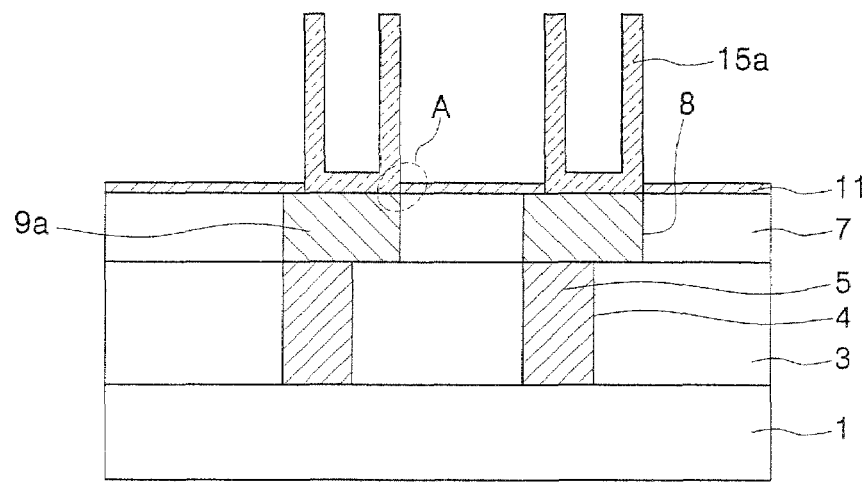
Figure 2:
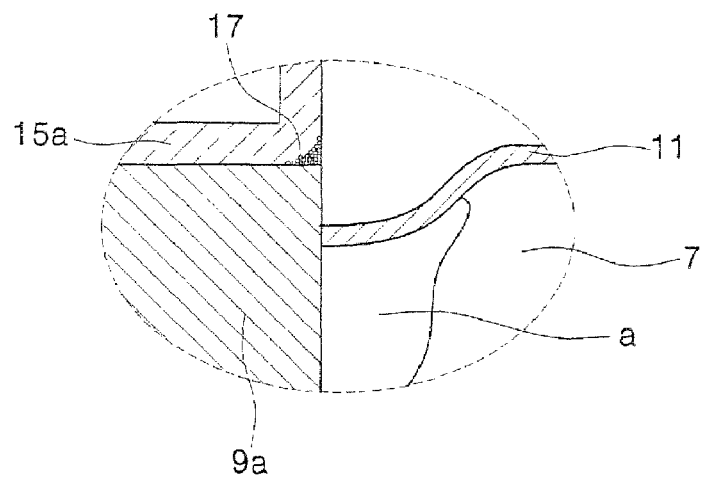
FIG. 2 is an enlarged view of the A-portion of FIG. 1E to illustrate conventional problems.

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

Figure 3:
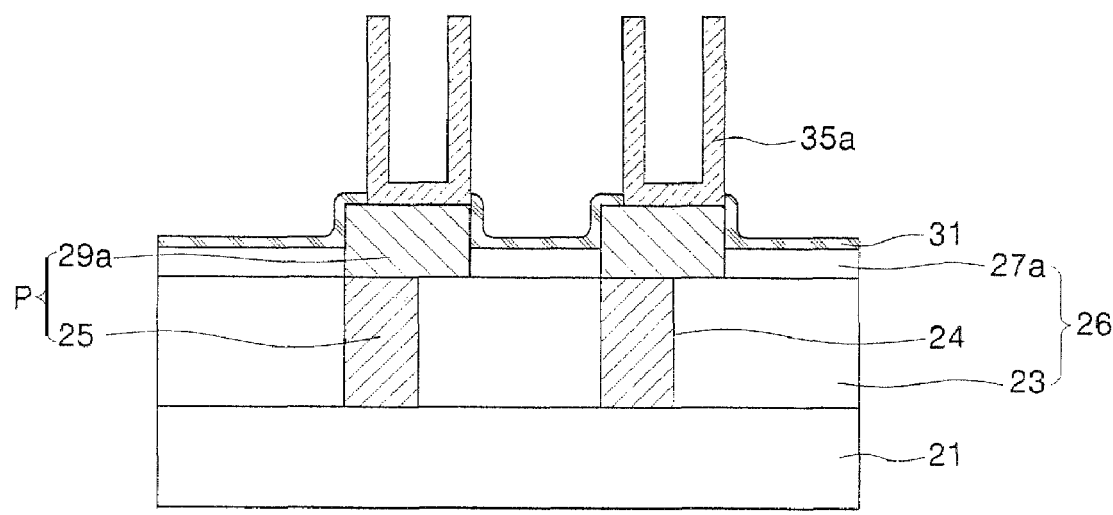
FIG. 3 is a cross-sectional view illustrating a semiconductor device having storage nodes according to an embodiment of the present invention.

FIG. 3 is a cross-sectional view illustrating a semiconductor device having storage nodes according to an embodiment of the present invention.

This semiconductor device includes an interlayer insulating layer 26 disposed on a semiconductor substrate 21; a conductive pad P disposed in the interlayer insulating layer 26 that contacts a predetermined portion of the substrate 21, its upper portion protruding above the interlayer insulating layer 26; an etch stop layer 31 disposed on the conductive pad P and the interlayer insulating layer 26; and a storage node 35a penetrating the etch stop layer 31 and disposed on the conductive pad P.

An upper portion of the conductive pad P protrudes from the interlayer insulating layer 26 by about 300 Å to 2000 Å. The interlayer insulating layer 26 is composed of a lower insulating layer 23 and an upper insulating layer 27a, which are sequentially stacked. The conductive pad P includes a buried contact plug 25 and a buffer conductive layer pattern 29a. The buried contact plug 25 is disposed in the lower insulating layer 23 and contacts a predetermined portion of the substrate 21. The buffer conductive layer pattern 29a covers at least a portion of the buried contact plug 25, and extends along one direction to have a wider bottom surface area a top surface area of the buried contact plug 25. An upper portion of the buffer conductive layer pattern 29a protrudes above the upper insulating layer.

FIGS. 4A through 4E are cross-sectional views illustrating a method of fabricating a semiconductor device having a storage node according to an embodiment of the present invention.

Figure 5A:
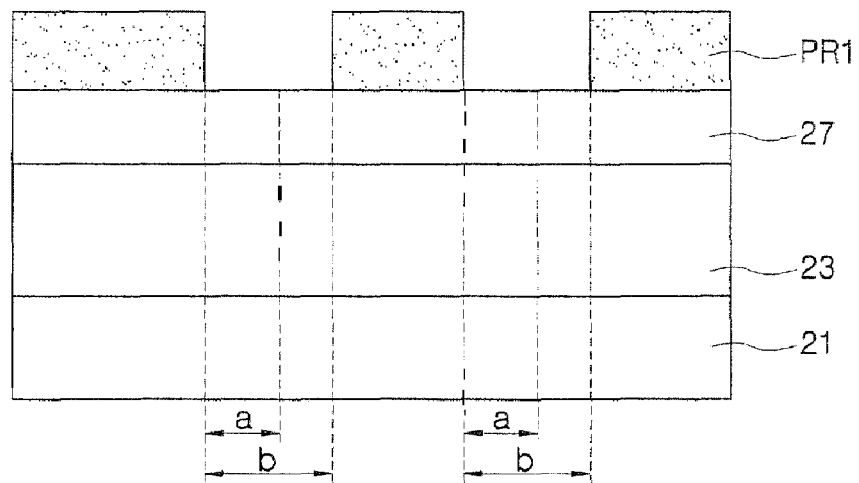
FIGS. 5A and 5D are cross-sectional views illustrating the integrally formed buried contact plug and the buffer conductive layer pattern.
Figure 5B:
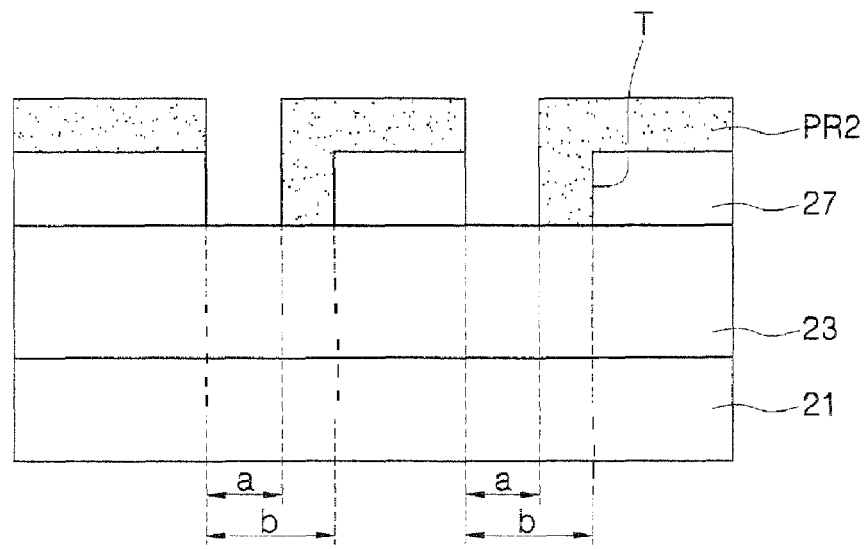
Figure 5C:
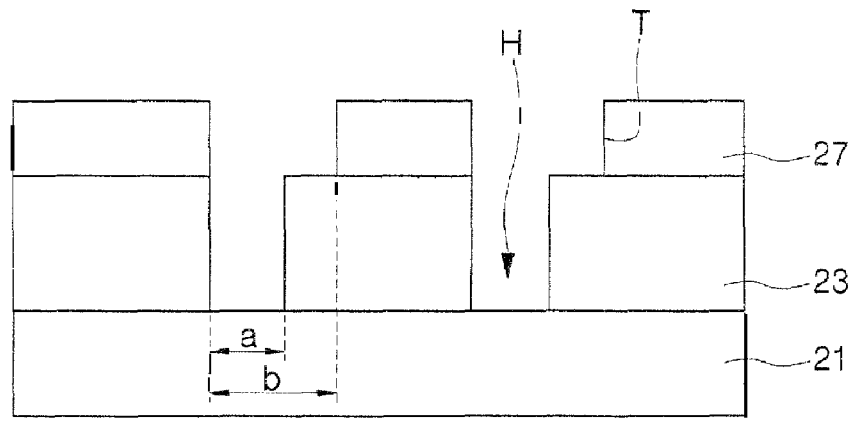
Figure 5D:
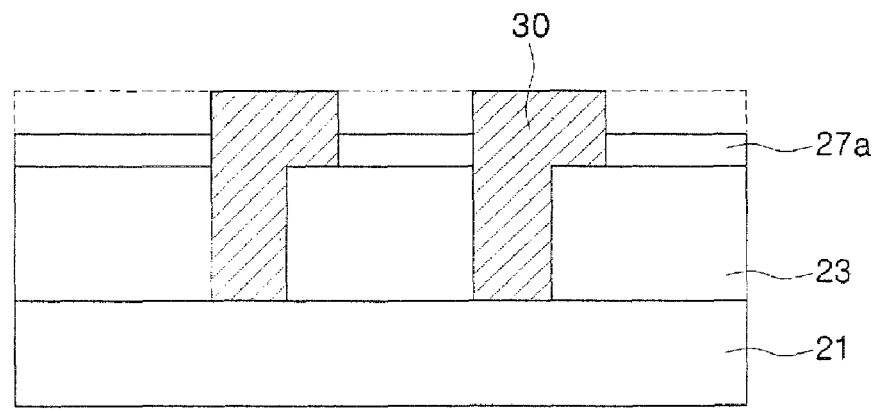

FIGS. 5A and 5D are cross-sectional views illustrating an integrally formed buried contact plug and buffer conductive layer pattern.

First, a method of fabricating a semiconductor device having the structure shown in FIG. 3 will be explained in reference to FIGS. 4A through 4E.

Figure 4A:
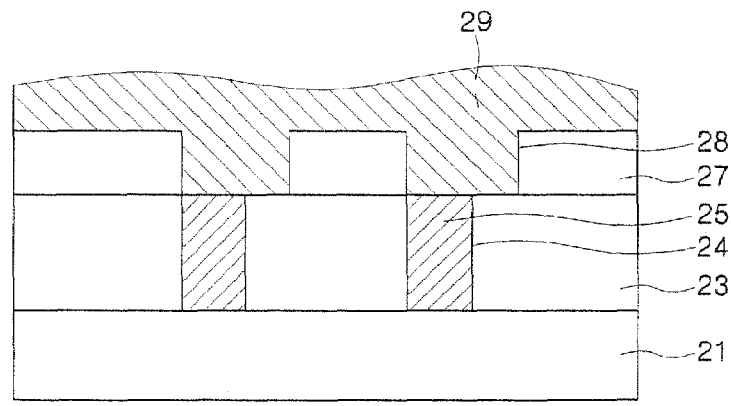
FIGS. 4A through 4E are cross-sectional views illustrating a method of fabricating a semiconductor device having storage nodes according to an embodiment of the present invention.

As shown in FIG. 4A, a semiconductor substrate 21 is prepared to have a lower structure that may include a transistor and a bit line (not shown). A lower insulating layer 23 is formed on the semiconductor substrate 21. The lower insulating layer 23 is patterned, thereby forming first contact holes that expose a predetermined portion of the substrate 21. Though not shown in the drawings, an insulation spacer may be formed on the sidewalls of the first contact holes 24.

Buried contact plugs 25 are formed to fill the first contact holes 24. The buried contact plugs 25 may be formed of a polycrystalline silicon layer. An upper insulating layer 27 is formed on the substrate having the buried contact plugs 25. The upper insulating layer 27 is patterned, thereby forming second contact holes 28 that expose the buried contact plugs 25 and extend along one direction to have wider areas than those of the surfaces of the buried contact plugs 25 that they contact. A buffer conductive layer 29 is formed on the substrate and fills the second contact holes 28. The buffer conductive layer 29 may be formed of the same material as that of the buried contact plugs 25.

Figure 4B:
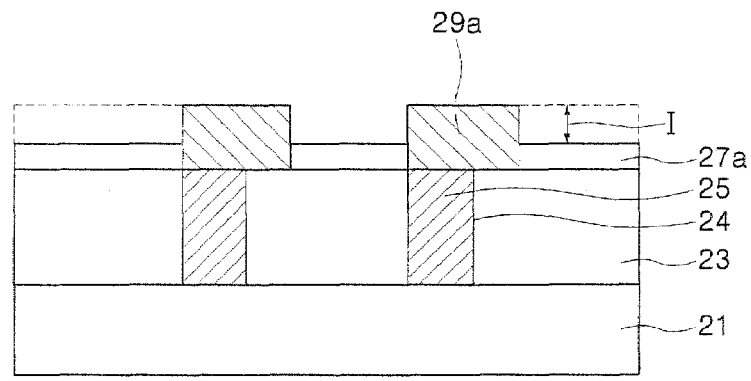

As shown in FIG. 4B, the buffer conductive layer 29 is etched until the upper insulating layer 27 is exposed, thereby forming buffer conductive layer patterns 29a that fill the second contact holes. The etching of the buffer conductive layer may use an etch back process or a CMP process. The buffer conductive layer patterns 29a may be formed with a thickness of about 1500 Å to 2500 Å. The upper insulating layer is over-etched so that upper portions of the buffer conductive layer patterns 29a protrude by about 300 Å to 1500 Å, as denoted by "I" in the figure. At this time, the etching process of the buffer conductive layer and the over-etching process of the upper insulating layer may be performed in-situ. The reference numeral '27a' in FIG. 4B refers to the over-etched upper insulating layer. A dotted line indicates the upper insulating layer before the over-etching.

Figure 4C:
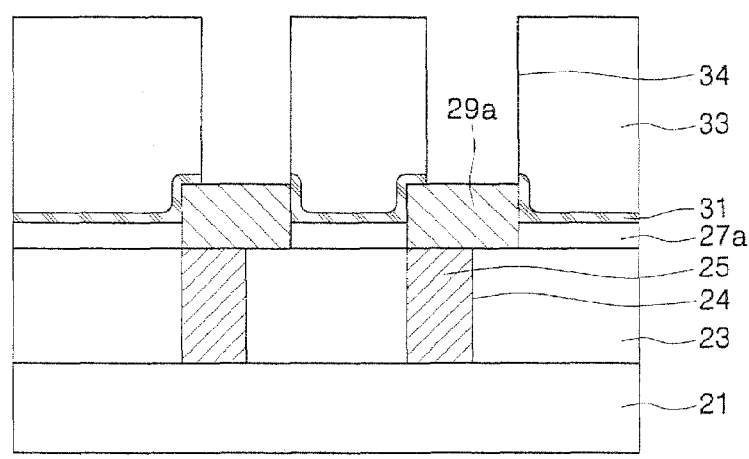

As shown in FIG. 4C, an etch stop layer 31 and a mold oxide layer 33 are sequentially formed on the substrate having the buffer conductive layer patterns 29a. The etch stop layer 31 may include a silicon nitride layer formed with a thickness of 500 Å to 600 Å. The mold oxide layer 33 may include a silicon oxide layer formed with a thickness of 15000 Å to 20000 Å. The mold oxide layer 33 and the etch stop layer 31 are sequentially patterned, thereby forming storage node contact holes 34 that expose the upper surfaces of the buffer conductive layer patterns 29a. At this time, the side surfaces of the buffer conductive layer patterns 29a are surrounded by the etch stop layer 31.

Figure 4D:
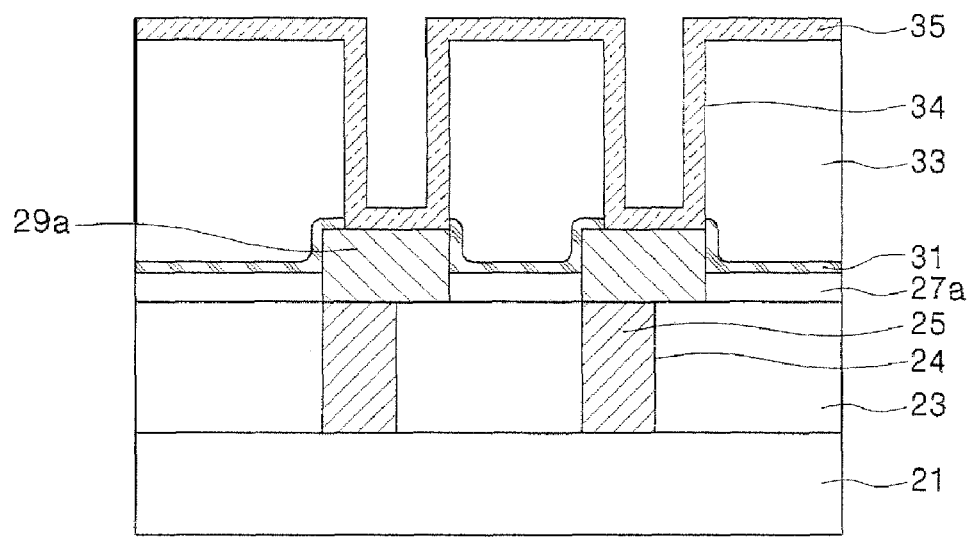

As shown in FIG. 4D, a conformal storage node layer 35 is formed on the semiconductor substrate having the storage node contact holes 34. The storage node layer 35 may be formed of a polycrystalline silicon layer.

Figure 4E:
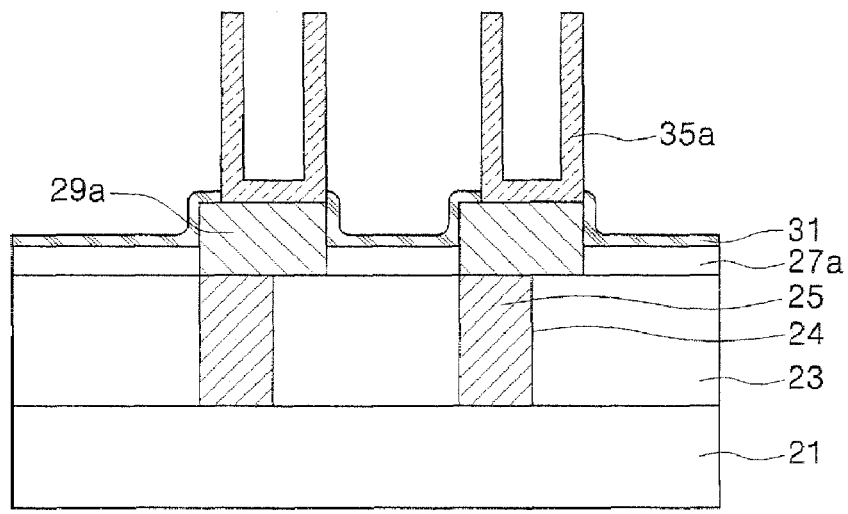

As shown in FIG. 4E, the storage node layer is treated using an etch back process or a CMP process until the mold oxide layer is exposed, thereby forming separate cylinder-shaped storage nodes 35a. At this time, the remaining mold oxide layer is removed using a wet etch process. The wet etch process may use an etchant of HF or BOE.

The buried contact plugs 25 and the buffer conductive layer patterns 29a may be formed integrally in addition to the method described as above. A method of integrally forming buried contact plugs and the buffer conductive layer patterns will be explained as follows in reference to FIGS. 5A and 5D.

As shown in FIG. 5A, a semiconductor substrate 21 having a buried contact plug region a, and a buffer conductive layer pattern region b that extends along one direction to have a wider area than that of the buried contact plug region a. A lower insulating layer 23 and an upper insulating layer 27 are sequentially formed on the substrate 21. A photosensitive layer is deposited on the upper insulating layer 27, then exposed and developed, thereby forming a first photosensitive layer pattern PR1 that expose the buffer conductive layer pattern region b.

As shown in FIG. 5B, the upper insulating layer is etched using the first photosensitive layer pattern PR1 as a mask, thereby forming trenches T that expose the lower insulating layer 23 corresponding to the buffer conductive layer pattern region b. The first photosensitive layer pattern is then removed. A photosensitive layer is deposited on the substrate having the trenches T, then exposed and developed, thereby forming a second photosensitive layer pattern PR2 that expose the buried contact plug region a.

As shown in FIG. 5C, the lower insulating layer is etched, using the second photosensitive layer pattern as a mask, thereby forming via holes H that concurrently expose the buffer conductive layer pattern region b and the buried contact plug region a. The second photosensitive layer pattern is then removed. Though not shown in the drawing, an insulation spacer may be formed on the sidewalls of the via holes H.

As shown in FIG. 5D, conductive layer patterns 30 are formed to fill the via holes H and the trenches T. The conductive layer patterns 30 may be formed by integrally patterning the buried contact plugs 25 and the buffer conductive layer patterns 29a shown in FIG. 4B. The conductive layer patterns 30 may be formed of a polycrystalline silicon layer or a metal layer. Then, like the first embodiment of the present invention, the upper insulating layer 27 is over-etched so that upper portions of the conductive layer patterns 29a protrude. The etching process of the buffer conductive layer patterns 29a and the over-etching process of the upper insulating layer may be performed in-situ. A dotted line of FIG. 5D indicates a thickness of an initial upper insulating layer, and the reference numeral '27a' refers to the upper insulating layer that remains after the over-etching.

As described above, in one embodiment of the present invention, unlike the conventional technology, the upper insulating layer is over-etched so that the upper portion of the buffer conductive layer pattern protrudes, thereby forming an etch stop layer on the remaining upper insulating layer after the etch process, to surround the side surface of the protruding buffer conductive layer pattern. Thus, even though etch residues may remain on the bottom surfaces and the lower side surfaces of the storage node contact holes during the process of etching the mold oxide layer and the etch stop layer, since the etch residues are surrounded by the etch stop layer and the buffer conductive layer pattern, the etch residues are prevented from acting as a chemical path during a subsequent wet etch process of removing the mold oxide layer. As a result, etchant is prevented from penetrating into the upper insulating layer below the etch stop layer, and into the lower structure through the upper insulating layer. Thus, other adverse effects are prevented as well, such as a collapsing etch stop layer and storage nodes that are easily torn off.

Figure 6:
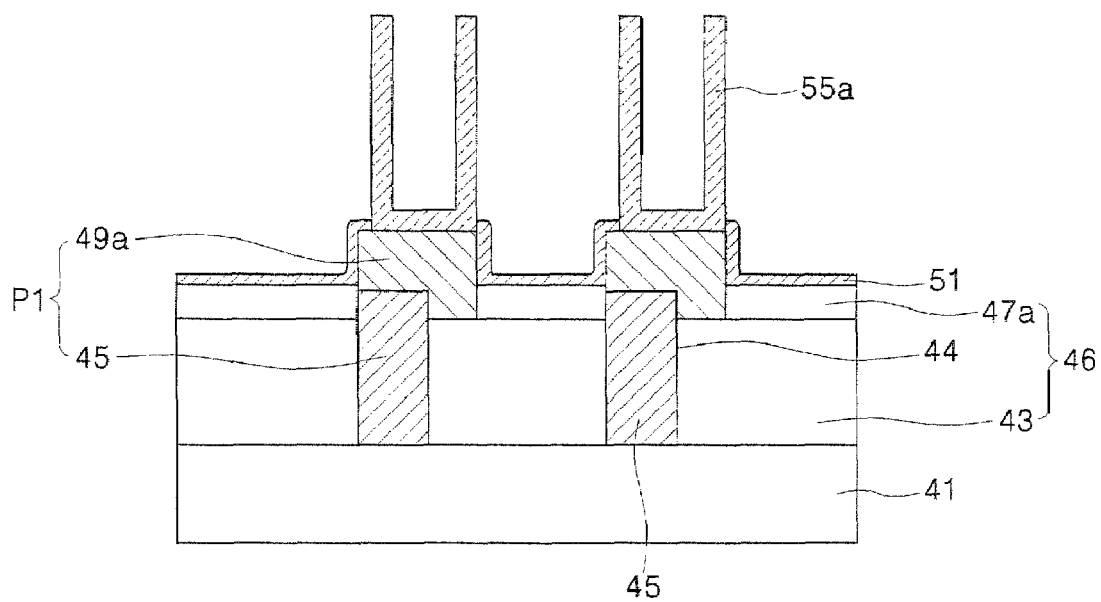
FIG. 6 is a cross-sectional view illustrating a semiconductor device having storage nodes according to another embodiment of the present invention.

FIG. 6 is a cross-sectional view illustrating a semiconductor device having storage nodes according to another embodiment of the present invention.

This semiconductor device includes an interlayer insulating layer 46 disposed on a semiconductor substrate 41; a conductive pad P1 that contacts a predetermined portion of the substrate 41 in the interlayer insulating layer 46, the upper portion of the conductive pad P1 that protrudes above the interlayer insulating layer 46; an etch stop layer 51 disposed on the conductive pad P1 and the interlayer insulating layer 46; and a storage node 55a that penetrates the etch stop layer 51 and is disposed on the conductive pattern P1.

The upper portion of the conductive pad P1 protrudes above the interlayer insulating layer 46 by about 300 Å to 2000 Å.

The interlayer insulating layer 46 is includes a lower insulating layer 43 and an upper insulating layer 47a, which are sequentially stacked. The conductive pad P1 includes a buried contact plug 45 and a buffer conductive layer pattern 49a. The buried contact plug 45 is disposed to contact a predetermined portion of the substrate 41 in the lower insulating layer 43, its upper portion protruding from the lower insulating layer 43. The buffer conductive layer pattern 49a covers at least a portion of the protruded buried contact plug 45, and extending along one direction to have a wider area than that of the buried contact plug 45 on the lower insulating layer 43, its upper portion protruding above the upper insulating layer.

FIGS. 7A through 7F are a cross-sectional view illustrating a method of fabricating the semiconductor device shown in FIG. 6.

Figure 7A:
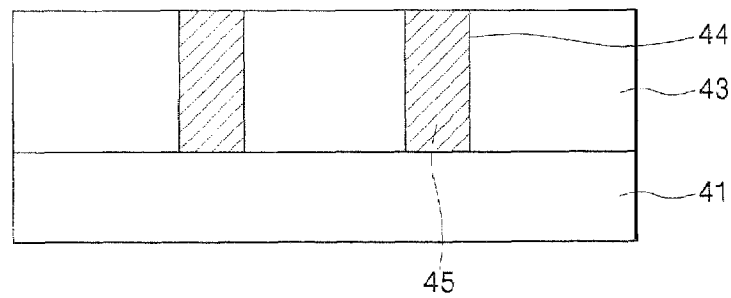
FIGS. 7A through 7F are cross-sectional views illustrating a method of fabricating a semiconductor device having storage nodes according to another embodiment of the present invention.
Figure 7B:
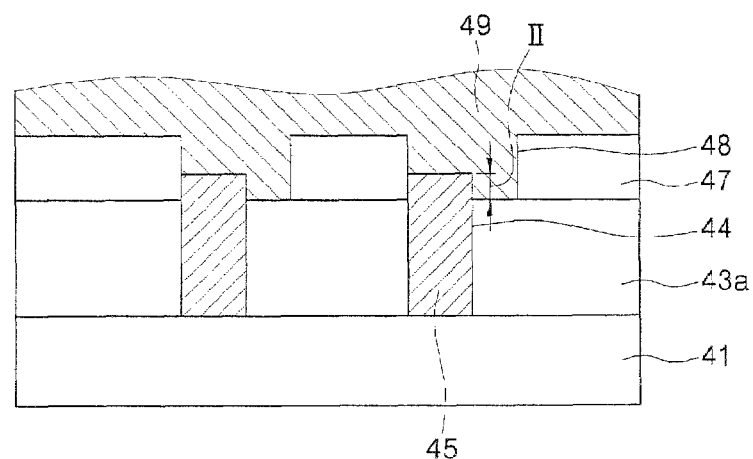

As shown in FIG. 7A, a lower insulating layer 43 is formed on a semiconductor substrate 41. The lower insulating layer 43 is patterned, thereby forming first contact holes 44 that contact a predetermined portion of the substrate 41. Buried contact plugs 45 are formed to fill the first contact holes 44. The buried contact plugs 45 may be formed of a polycrystalline silicon layer. As shown in FIG. 7B, the lower insulating layer is over-etched so that the upper portion of the buried contact plugs 45 protrude by about 300 Å to 1500 Å. An upper insulating layer 47 is formed on the substrate having the buried contact plugs 45. The upper insulating layer 47 is patterned, thereby forming second contact holes 48. The second contact holes 48 are patterned to expose the buried contact plugs 45, and to extend along one direction beyond one edge of the buried contact plugs 45. A buffer conductive layer 49 may be formed on the substrate having the second contact holes 48. The buffer conductive layer 49 is formed of the same material as that of the buried contact plugs 45. Reference numeral '43a' of FIG. 7B refers to the lower insulating layer that remains after the etch process.

Figure 7C:
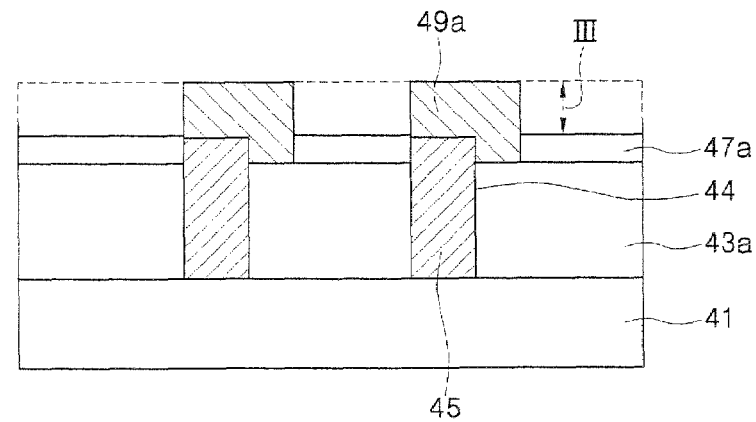

As shown in FIG. 7C, the buffer conductive layer is etched until the upper insulating layer 47 is exposed, thereby forming buffer conductive layer patterns 49a that fill the second contact holes 48. The buffer conductive layer patterns 49a may be formed of about 1500 Å to 2500 Å. The buffer conductive layer pattern 49a may have a step height difference between its portion that contacts the buried contact plug 45 and the portion that contacts the lower insulating layer 43a. In other words, the bottom of the buffer conductive layer patterns 49a include two surfaces, each at a different level. As a result, contact areas between the buffer conductive layer patterns 49a and storage nodes to be formed later are increased. The upper insulating layer is over-etched so that the upper portions of the buffer conductive layer patterns 49a protrude by about 300 Å to 1500 Å, as indicated by "III" in FIG. 7C.

The etching process of the buffer conductive layer and the over-etching process of the upper insulating layer may be performed in-situ. A reference numeral '47a' of FIG. 7C indicates an over-etched upper insulating layer. The dotted line indicates an upper insulating layer before performing the over-etching process.

Figure 7D:
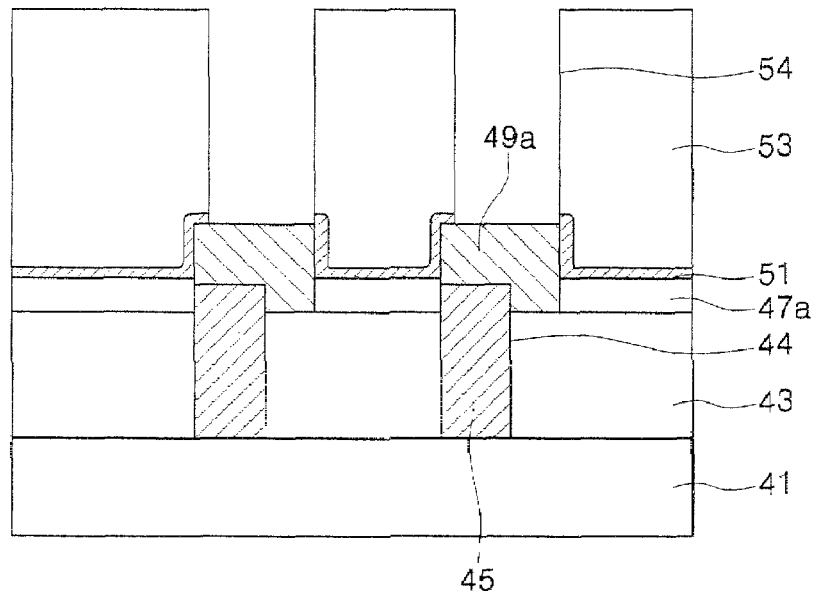

As shown in FIG. 7D, an etch stop layer 51 and a mold oxide layer 53 are sequentially formed on the substrate having the buffer conductive layer patterns 49a. The etch stop layer 51 may include a silicon nitride layer. The mold oxide layer 53 may include a silicon oxide layer. The etch stop layer 51 may be formed with a thickness of about 500 Å to 600 Å, and the mold oxide layer 53 may be formed with a thickness of about 15000 Å to 20000 Å. The mold oxide layer 53 and the etch stop layer 51 are sequentially patterned, thereby forming storage node contact holes 54 that expose the upper surfaces of the buffer conductive layer patterns 49a. At this time, the side surfaces of the buffer conductive layer patterns 49a are surrounded by the etch stop layer 51.

Figure 7E:
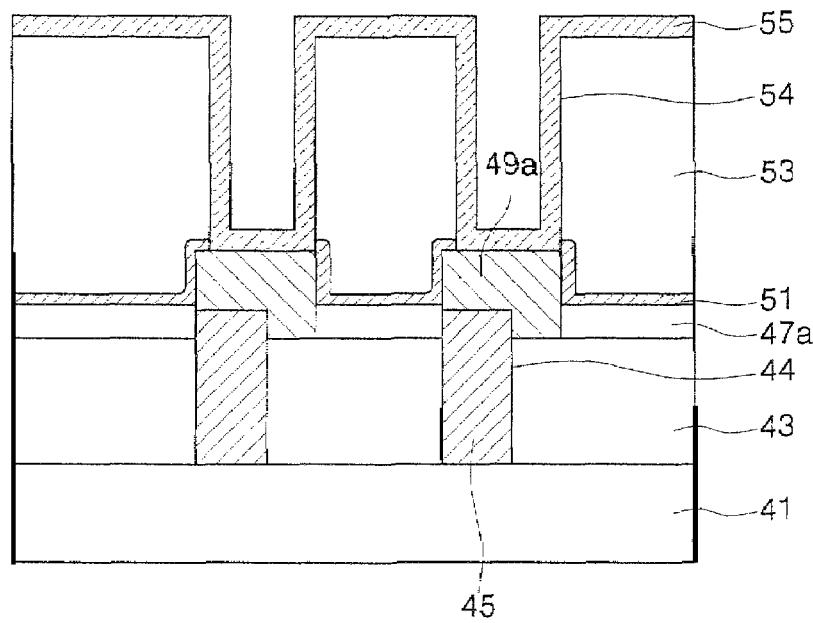

As shown in FIG. 7E, a conformal storage node layer 55 is formed on the substrate having the storage node contact holes 54. The storage node layer 55 may include a polycrystalline silicon layer.

Figure 7F:
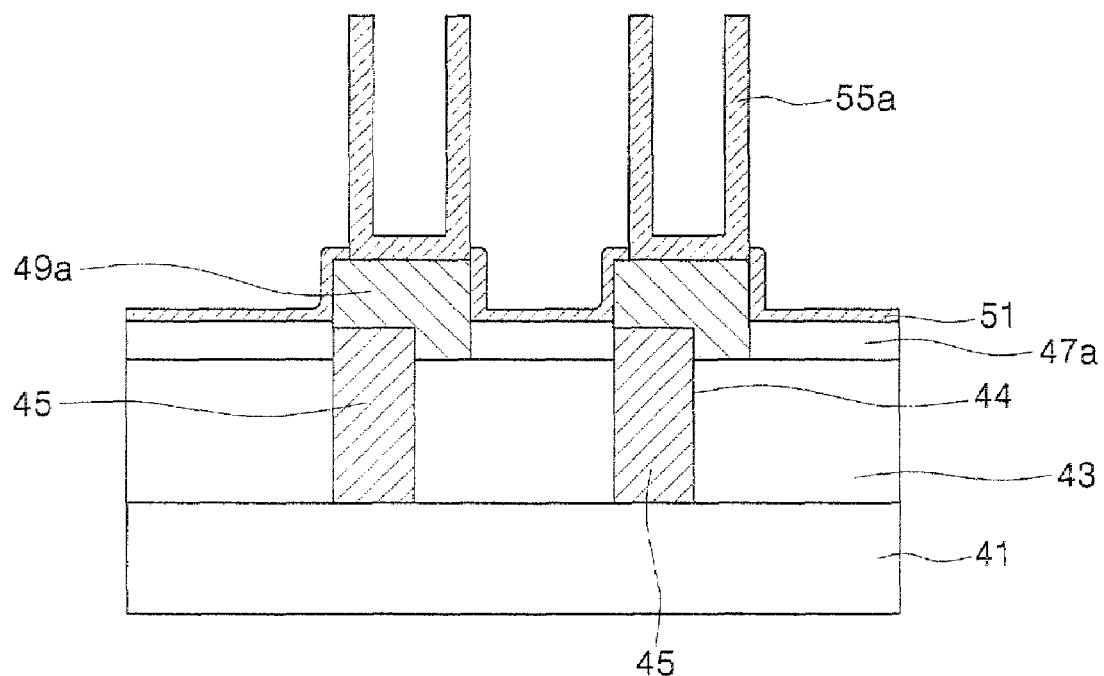

As shown in FIG. 7F, the storage node layer is treated using an etch back process or a CMP process until the surface of the mold oxide layer is exposed, thereby forming separated cylinder-shaped storage nodes 55a. The mold oxide layer that remains after etching is removed. The removal of the mold oxide layer may be performed using a wet etch process. The wet etch process may include HF or BOE.

In another embodiment of the present invention, a buried contact plug is formed so that the upper portion protrudes above the lower insulating layer, and a buffer conductive layer pattern is formed so that the upper portion protrudes above the upper insulating layer, and an etch stop layer is formed on the upper insulating layer to surround the side surface of the protruded buffer conductive layer pattern, unlike the conventional technology. Thus, even though etch residues may remain on the bottom surfaces and the lower side surfaces of the storage node contact holes during the etch process of the mold oxide layer and the etch stop layer, since the etch residues are surrounded by the etch stop layer and the buffer conductive layer pattern, the etch residues are prevented from acting as a chemical path during a wet etch process to remove the mold oxide layer. As a result, the etchant does not penetrate through into the upper insulating layer below the etch stop layer.

Further, since the buffer conductive layer patterns are formed on the buried contact plug structure protruding at its upper portion, unlike the conventional technology, the contact area between the buffer conductive layer pattern and the buried contact plug is increased and thus, the adhesive force between them is increased.

According to the present invention, since the buffer conductive layer pattern is formed so that its upper portion protrudes, and the etch stop layer is formed to surround the upper side surface of the buffer conductive layer pattern that protrudes above the insulating layer, a penetrating path of the wet etchant during the wet etch process to remove the mold oxide layer can be cut off completely. That is, even though etch residues remain on the bottom surfaces and the lower side surfaces of the storage node contact holes during the process of etching the mold oxide layer and the etch stop layer, since the etch residues are surrounded by the etch stop layer and the buried contact plug, a penetrating path of the wet etchant during a following wet etch process to remove the mold oxide layer is cut off completely. Therefore, the insulating layer is prevented from being etched by the wet etchant.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a semiconductor device, the method comprising:
    forming an interlayer insulating layer on a semiconductor substrate;
    forming a conductive pad in the interlayer insulating layer;
    selectively etching the interlayer insulating layer so that an upper portion of the conductive pad protrudes above the interlayer insulating layer;
    sequentially forming an etch stop layer and a mold oxide layer on the interlayer insulating layer and the protruded conductive pad;
    etching the mold oxide layer and the etch stop layer to expose an upper surface of the conductive pad; and
    forming a storage node on the exposed upper surface of the conductive pad.

2. The method according to claim 1, wherein selectively etching the interlayer insulating layer is performed so that an upper portion of the conductive pad protrudes above the interlayer insulating layer by about 300 Å to 2000 Å.

3. The method according to claim 1, wherein selectively etching the interlayer insulating layer uses an etchant containing fluorine.

4. The method according to claim 1, wherein forming the interlayer insulating layer comprises sequentially forming a lower insulating layer and an upper insulating layer.

5. The method according to claim 4, wherein forming the conductive pad comprises:
    selectively etching the upper insulating layer to form a trench;
    selectively etching the lower insulating layer exposed by the trench to form a via hole that exposes a portion of the substrate;
    forming a conductive layer on the substrate having the via hole; and
    planarizing the conductive layer to fill the trench and the via hole.

6. The method according to claim 5, wherein the conductive layer includes one of a polycrystalline silicon layer and a metal layer.

7. The method according to claim 5, wherein planarizing the conductive layer is performed using one of an etch back process and a chemical mechanical polishing (CMP) process.

8. The method according to claim 4, wherein forming the conductive pad comprises:
    forming a buried contact plug in the lower insulating layer to be in contact with a portion of the substrate; and
    forming a buffer conductive layer pattern covering at least a portion of the buried contact plug in the upper insulating layer, and extending along one direction beyond an edge of the buried contact plug.

9. The method according to claim 8, wherein the buffer conductive layer pattern is formed with a thickness of about 1500 Å to 2500 Å.

10. The method according to claim 8, after forming the buried contact plug, further comprising selectively etching the lower insulating layer so that an upper portion of the buried contact plug protrudes above the lower insulating layer.

11. The method according to claim 10, wherein selectively etching the lower insulating layer is performed so that an upper portion of the buried contact plug protrudes above the lower insulating layer by about 1500 Å to 2500 Å.

12. The method according to claim 1, wherein the etch stop layer includes silicon nitride.

13. The method according to claim 1, wherein the storage node includes one of a polycrystalline silicon layer and a metal layer.

14. The method according to claim 1, after forming the storage node, further comprising removing the remaining mold oxide layer.

15. The method according to claim 14, wherein removing the mold oxide layer is performed using a wet etch process.

16. The method according to claim 15, wherein the wet etch process uses one HF and BOE as an etchant.

* * * * *